(12) United States Patent
Koike-Akino et al.

(10) Patent No.: US 9,432,124 B2
(45) Date of Patent: Aug. 30, 2016

(54) INTER-CHANNEL INTERFERENCE MANAGEMENT FOR OPTICAL SUPER-CHANNELS

(71) Applicant: Mitsubishi Electric Research Laboratories, Inc., Cambridge, MA (US)

(72) Inventors: Toshiaki Koike-Akino, Medford, MA (US); Keisuke Kojima, Weston, MA (US); David S Millar, Somerville, MA (US); Kieran Parsons, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/487,676

(22) Filed: Sep. 16, 2014

(65) Prior Publication Data
US 2016/0080087 A1 Mar. 17, 2016

(51) Int. Cl.
| | |
|---|---|
| H04B 10/516 | (2013.01) |
| H04B 10/25 | (2013.01) |
| H04B 10/50 | (2013.01) |
| H04J 14/02 | (2006.01) |
| H04L 1/00 | (2006.01) |
| H04L 25/03 | (2006.01) |

(52) U.S. Cl.
CPC ........ *H04B 10/516* (2013.01); *H04B 10/2504* (2013.01); *H04B 10/506* (2013.01); *H04J 14/02* (2013.01); *H04L 1/0041* (2013.01); *H04L 1/0048* (2013.01); *H04L 25/03343* (2013.01); *H04L 25/03821* (2013.01)

(58) Field of Classification Search
CPC .......... H04B 10/25; H04B 10/2504–10/2507; H04B 10/2543–10/2563; H04J 14/04; H04L 1/0041

See application file for complete search history.

(56) References Cited

U.S. PATENT DOCUMENTS

| | | | |
|---|---|---|---|
| 7,002,897 B2 | 2/2006 | Jones et al. | |
| 7,007,220 B2 | 2/2006 | Zhang et al. | |

(Continued)

FOREIGN PATENT DOCUMENTS

WO     WO9938352 A1     7/1999

OTHER PUBLICATIONS

Koike-Akino et al., "Han-Kobayashi and Dirty-Paper Coding for Superchannel Optical Communication," Journal of Lightwave Technology, IEEE. vol. 33, No. 7, pp. 1292-1299. Apr. 1, 2015.

(Continued)

*Primary Examiner* — David Payne
*Assistant Examiner* — Casey Kretzer
(74) *Attorney, Agent, or Firm* — Gene Vinokur; James McAleenan; Hironori Tsukamoto (57) ABSTRACT

The transmission of data from a transmitter to a receiver over an optical super-channel including a set of sub-channels of different frequencies includes partitioning the data into a set of data streams including one data stream for each sub-channel and partitioning each data stream into a set of sub-streams. Each sub-stream of each data stream is encoded with different forward error correction (FEC) codes to produce a set of encoded sub-streams for each data stream, and the set of encoded sub-streams of each data stream are superimposed with different powers to produce a set of encoded data streams. The set of encoded data streams is multiplexed to produce an optical signal transmitted over the set of sub-channels of the optical super-channel.

19 Claims, 10 Drawing Sheets

(56) References Cited

U.S. PATENT DOCUMENTS

| | | | |
|---|---|---|---|
| 7,016,440 B1 | 3/2006 | Singer et al. | |
| 7,742,386 B2 | 6/2010 | Jones et al. | |
| 8,065,582 B2 | 11/2011 | Watson et al. | |
| 8,160,013 B2 | 4/2012 | Kim et al. | |
| 8,327,240 B2 | 12/2012 | Kolze et al. | |
| 8,370,706 B2 | 2/2013 | Chin et al. | |
| 8,412,252 B2 | 4/2013 | Choi et al. | |
| 8,521,020 B2 | 8/2013 | Welch et al. | |
| 8,625,694 B1 | 1/2014 | Lee et al. | |
| 8,631,305 B2 | 1/2014 | Blakey et al. | |
| 8,645,788 B2 | 2/2014 | Rahn et al. | |
| 2003/0106013 A1 | 6/2003 | Jarchi et al. | |
| 2003/0167432 A1 | 9/2003 | Zhang et al. | |
| 2005/0276614 A1 | 12/2005 | Kim et al. | |
| 2006/0156185 A1 | 7/2006 | Zhang et al. | |
| 2007/0291867 A1 | 12/2007 | Khan et al. | |
| 2009/0268662 A1* | 10/2009 | Larsson | H03M 7/30 370/328 |
| 2010/0028002 A1* | 2/2010 | Qian | H04J 14/0227 398/79 |
| 2011/0159897 A1 | 6/2011 | Choi et al. | |
| 2013/0089023 A1 | 4/2013 | Shin et al. | |
| 2013/0108268 A1 | 5/2013 | Valiveti et al. | |
| 2013/0182689 A1 | 7/2013 | Choi et al. | |
| 2013/0294225 A1 | 11/2013 | Zhang et al. | |
| 2014/0270759 A1* | 9/2014 | Djordjevic | H04L 1/0043 398/44 |
| 2014/0363173 A1* | 12/2014 | Dave | H04B 10/25137 398/149 |
| 2015/0086215 A1* | 3/2015 | Chen | H04B 10/2507 398/136 |

OTHER PUBLICATIONS

Te Han et al., "A new achievable rate region for interference channel," IEEE Transactions on Information Theory. pp. 49-60. Jan. 1, 1981.

Liu et al., "Interference Channels with Correlated Receiver Side Information," IEEE transactions on information theory, vol. 42 No. 12, pp. 5984-5998, Dec. 1, 2010.

* cited by examiner

INTER-CHANNEL INTERFERENCE MANAGEMENT FOR OPTICAL SUPER-CHANNELS

FIELD OF THE INVENTION

This invention relates generally to coherent optical communications systems, and more particularly to transmitting data over an optical super-channel.

BACKGROUND OF THE INVENTION

Coherent optical communications enable data to be transmitted over long haul optical transmission networks, typically greater than 2,000 km, at high data rates. A coherent detector requires that a received phase-modulated optical signal is digitized. Digitizing the received signal requires a high-speed analog-to-digital converter (ADC). However, an increase in serial ADC sampling rates is difficult to implement for single-wavelength coherent detection at data rates greater than 100 Gbit/s.

A super-channel transmission technique is an evolution in dense wavelength division multiplexing (DWDM), in which multiple optical carriers are combined on a single super-channel to realize a higher data rate in total, and is brought into service in a single operational cycle. Rather than a single wavelength channel, e.g., of 100 Gbit/s, a super-channel uses a multi-wavelength signal, in which each wavelength operates as a sub-channel at the maximum data rate permitted by ADC components.

One notable difference between the super-channel and conventional wavelength division multiplexing (WDM) is a size of a gap between frequencies of different sub-channels. The super-channel can decrease the size of the gap between wavelengths of the sub-channels so that the super-channel effectively operates as a single wideband channel, in terms of adding, dropping, and routing data. Various techniques can be used to reduce the sub-channels frequency gap to the MHz range. These techniques include orthogonal-band-multiplexing (OBM), orthogonal frequency division multiplexing (OFDM), no guard interval (NGI)-OFDM, Nyquist WDM, and multi-channel equalization (MCE)-WDM.

However, the small size of the gap between frequencies of different sub-channels can cause inter-channel interference (ICI) in the signals transmitted on the sub-channels. The ICI is considered as additional noise in the received signals and the received data has to be recovered subject to sometimes prohibitively large total noise. To avoid the ICI, conventional systems filter the transmitted signal, e.g., using a root-raised-cosine (RRC) filter to minimize the ICI. See, e.g., US 2012/0301142. However, such filters suppress some data in the transmitted signal, which can lead to the reduction of the transmission rates.

Accordingly, there is a need in the art for a different approach in handling the ICI of the signal transmitted over an optical super-channel formed by a set of sub-channels in the same fiber.

SUMMARY OF THE INVENTION

Some embodiments of the invention are based on a realization that inter-channel interference (ICI) of signals transmitted over sub-channels of a super-channel should not be considered as a noise, but rather as data transmitted over frequency-wise adjacent sub-channels. Based on this realization, some embodiments, instead of decoding smaller data transmitted over an intended sub-channel subject to larger noise, jointly decode larger data transmitted over neighboring sub-channels subject to lower noise.

Some embodiments of the invention, instead of filtering the signal to reduce the ICI, filter the signal to shape a spectrum of the ICI in a manner advantageous for the joint decoding at receivers for each sub-channel. For example, one embodiment filters the transmitted signal to increase a concentration of the power of the ICI. The concentration of ICI power increases a proportion of the ICI data that can be decoded at the receivers.

However, the ICI creates inter-symbol interference (ISI) with frequency offset due to frequency gaps between sub-channels of the optical super-channel. Some embodiments of the invention are based on another realization that the knowledge of the spectrum of the ICI enables equalization of the ISI for decoding portions of the data streams transmitted on neighboring sub-channels.

Furthermore, some embodiments are based on recognition that in some situations the joint decoding of the larger data can limit the data rate of the transmission. Based on this recognition, some embodiments partition the transmitted data streams into multiple smaller portions and jointly decode various combinations of the portions of the data transmitted over neighboring sub-channels.

For example, one embodiment partitions the data on common and individual portions according to the Han-Kobayashi principle. This embodiment jointly decodes the common portions of the data streams transmitted over the neighboring sub-channels, and cancel those portions of ICI sub-channel data to decode the individual portions transmitted over the intended sub-channel. Some embodiments extend this principle to super-channel transmissions, in which more than two partitioning are performed for multiple carrier interference channels.

Some embodiments are based on another realization that dirty-paper coding (DPC) can be used not only for single carrier interference, but for multiple carrier interference as in the case of the ICI. To that end, some embodiments use cooperative super-position coding based on the DPC principle when the multiple transmitters share at least some portions of the data. The DPC uses interference alignment of transmitted data streams to decrease the effect of the ICI.

In some embodiments, using information related to the ICI spectrum and sub-channel signal-to-noise ratio (SNR), the coding rates of sub-streams and power arrangements of super-position coding, as well as filter shaping are adaptively adjusted to maximize the reliability and/or the data rates.

Accordingly, one embodiment discloses a method for transmission of data from a transmitter to a receiver over an optical super-channel including a set of sub-channels of different frequencies. The method includes partitioning the data into a set of data streams including one data stream for each sub-channel; partitioning each data stream into a set of sub-streams; encoding each sub-stream of each data stream with a corresponding forward error correction (FEC) code to produce a set of encoded sub-streams for each data stream, wherein at least two encoded sub-streams in the set of encoded sub-streams are encoded with different FEC codes; superimposing the set of encoded sub-streams of each data stream to produce a set of encoded data streams, wherein at least two encoded sub-streams in the set of encoded sub-streams are superimposed with different powers; multiplexing the set of encoded data streams to produce an optical signal; and transmitting the optical signal over the set of sub-channels of the optical super-channel.

Another embodiment discloses a system for transmission of data over an optical super-channel including a set of sub-channels of different wavelengths, including a data de-multiplexer (DDM) for splitting the data into a set of data streams including one data stream for each sub-channel; a set of sub-channel encoders including one sub-channel encoder for each data stream for producing a set of encoded data streams, wherein each sub-channel encoder is configured for partitioning a data stream into sub-streams, encoding each sub-stream with different forward error correction (FEC) codes, and superimposing the encoded sub-streams with different powers to produce an encoded data stream of the set of encoded data streams; and an optical wavelength multiplexer (WM) for multiplexing the set of encoded data streams and transmitting the multiplexed encoded data streams over the sub-channels of the optical super-channel.

Yet another embodiment discloses a system for transmission of data over an optical super-channel including a set of sub-channels of different wavelengths, including a set of sub-channel receivers for receiving a set of received data streams including one received data stream for each sub-channel receiver, wherein the received data stream includes at least portions of encoded sub-streams transmitted over different sub-channels of the optical super-channel, wherein a sub-channel receiver includes multiple decoders for decoding, jointly or successively, each encoded sub-stream of the received data stream to produce a set of decoded sub-streams; and a data multiplexer (DM) for combining the decoded sub-streams to produce the data.

DETAILED DESCRIPTION OF THE PREFERRED EMBODIMENT

Figure 1:
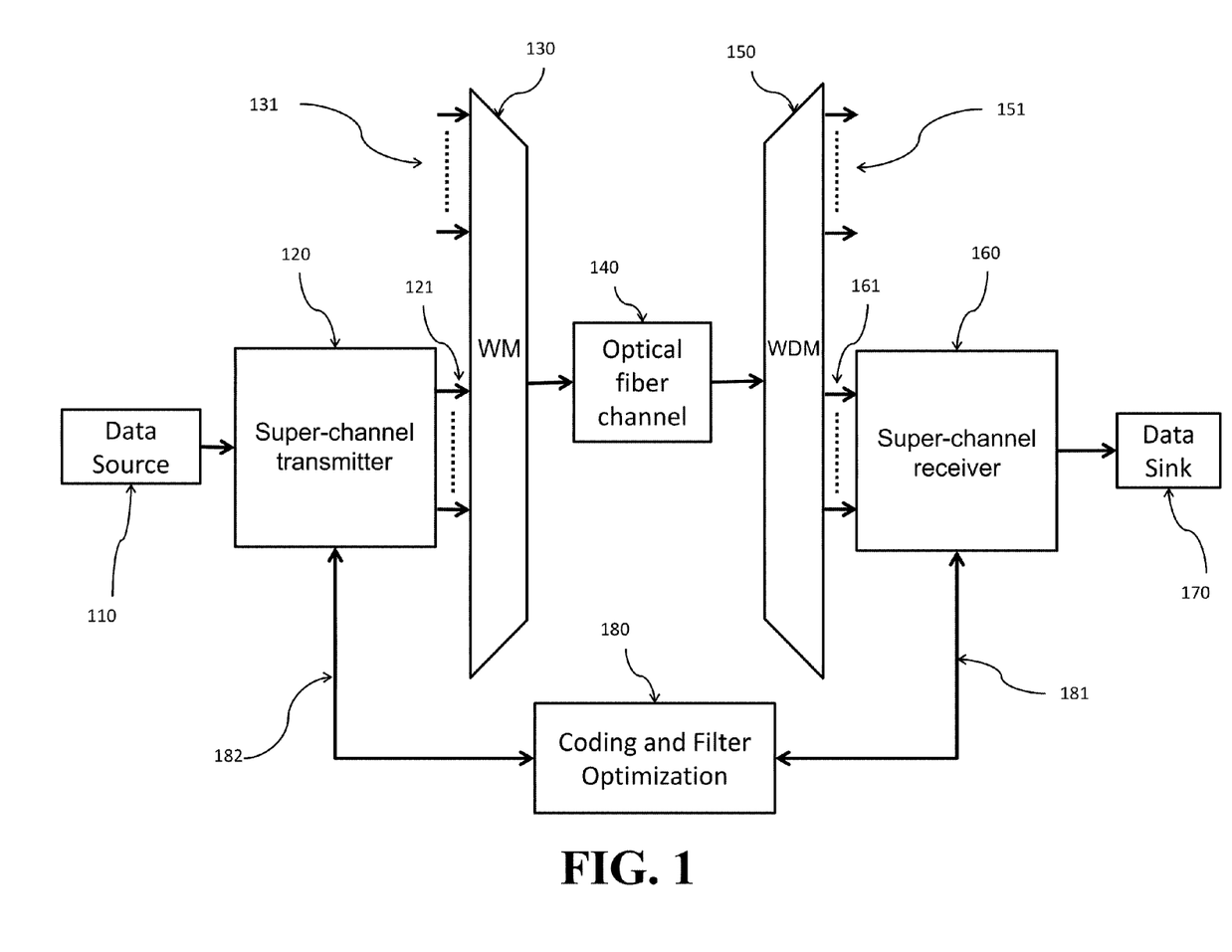
FIG. 1 is a block diagram of a super-channel transmission system according to some embodiments of the invention.

FIG. 1 shows a block diagram of a super-channel transmission system for transmitting data to a receiver over an optical fiber channel. A sender transmits digital data from data source 110 by a super-channel transmitter 120, which generates a set of data streams to be transmitted over a set of sub-channels of different wavelengths 121. The data streams are combined by an optical wavelength multiplexer (WM) 130, possibly with other independent wavelengths 131 to form an optical signal for transmitting over the optical fiber channel 140.

On the receiver side, the optical signal is first separated according to multiple wavelengths 151, 161 by an optical wavelength de-multiplexer (WDM) 150. Some of those wavelengths 151 are not related to a super-channel receiver 160. From the other related wavelengths 161, the super-channel receiver 160 recovers the transmitted data 110 to a data sink 170. Some embodiments of the invention use a control block 180 to optimize the super-channel transmitter 120 and the super-channel receiver 160, by monitoring 181 the inter-channel interference (ICI) and adjusting 182 forward-error correction (FEC) codes and shaping filters of the super-channel transceivers, to increase the data rate of the transmission for given bandwidth and channel spacing.

Figure 2A:
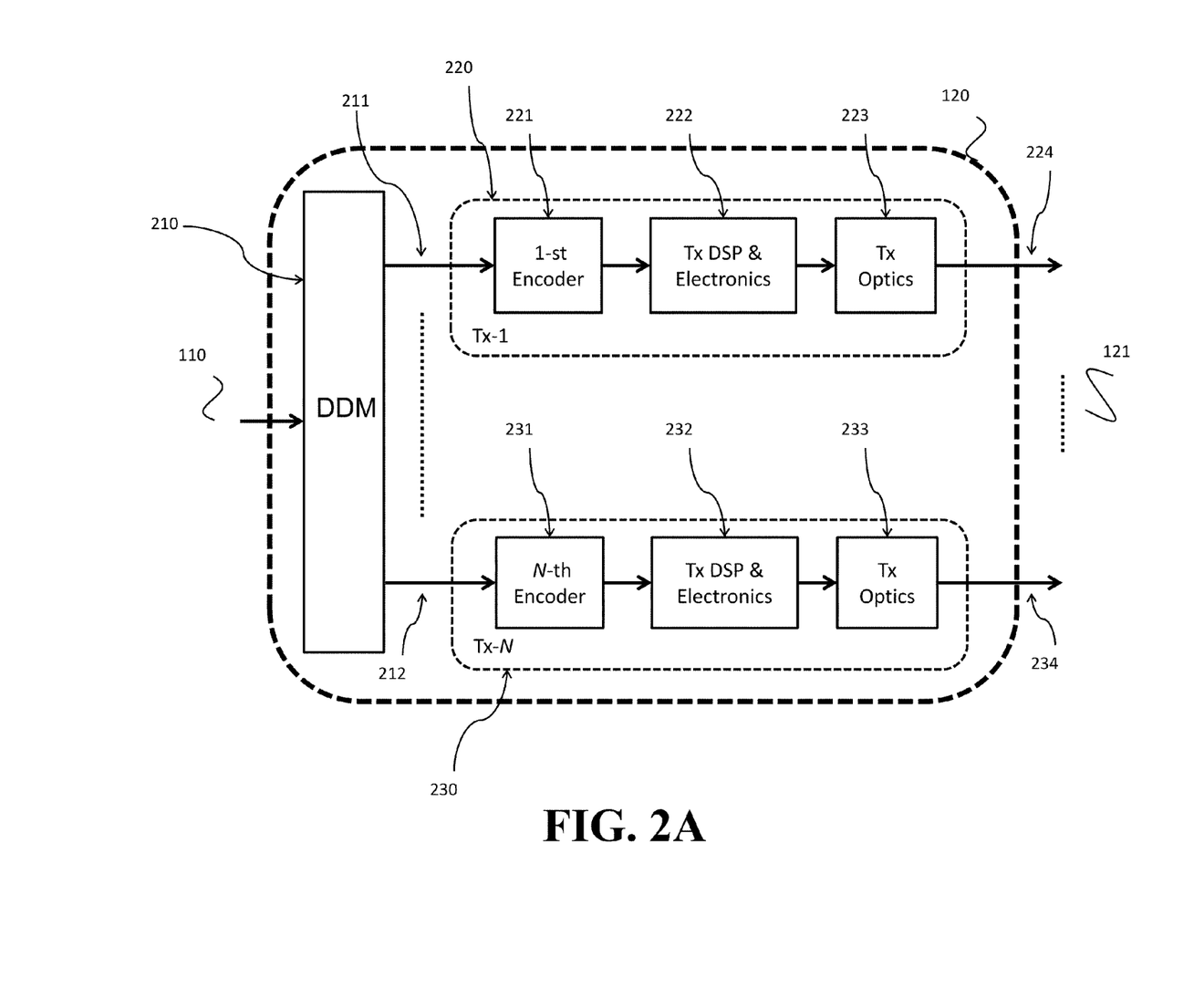
FIG. 2A is a block diagram of a super-channel transmitter for transmitting data to a receiver over an optical super-channel according to some embodiments of the invention.

FIG. 2A shows a block diagram of the super-channel transmitter 120 using an optical super-channel formed by a set of sub-channels of different wavelengths 121. The super-channel transmitter includes a data de-multiplexer (DDM) 210 and multiple sub-channel transmitters 220 and 230. The DDM 210 partitions the data from the data source 110 into a set of data streams 211 and 212 for transmission over the set of sub-channels of the super-channel. For example, the DDM produces multiple data streams with various bit-rates, e.g., 104 Gbit/s, by partitioning the source data into four at an input rate of 416 Gbit/s. The number of data streams, i.e., N, corresponds to the number of wavelength sub-channels used by the super-channel transmitter, and can be any integer greater than one.

The set of data streams 211 and 212 are encoded by a set of sub-channel encoders 221 and 231. In some embodiments, the sub-channel encoders are independent, while encoders can operate cooperatively in some alternative embodiments. The encoded streams are then sent to electronic pre-processors 222, 232 on a per sub-channel basis to perform, e.g., spectral shaping filtering. In one embodiment, the spectral shaping filter uses a non-square-root raised cosine (NS-RRC) filter. In contrast with the square-root raised cosine (RRC) filters, the NS-RRC filter is preserving the ICI during the transmitting, and the parameters of the NS-RRC filter can be varied to maximize the data rate of transmission. The electronic pre-processors 222, 232 can also perform other operations, such as dispersion and non-linear pre-compensation. Some embodiments of the invention, instead of filtering the signal to reduce an inter-channel interference (ICI), use a spectral shaping filter to shape a spectrum of the ICI to preserve the ICI in a manner advantageous for decoding at the receivers of the super-channel. The data streams are then sent to the transmitter optics 223, 233, e.g., transmitter optical sub-assembly (TOSA), for generating optical wavelengths 224, 234.

Figure 2B:
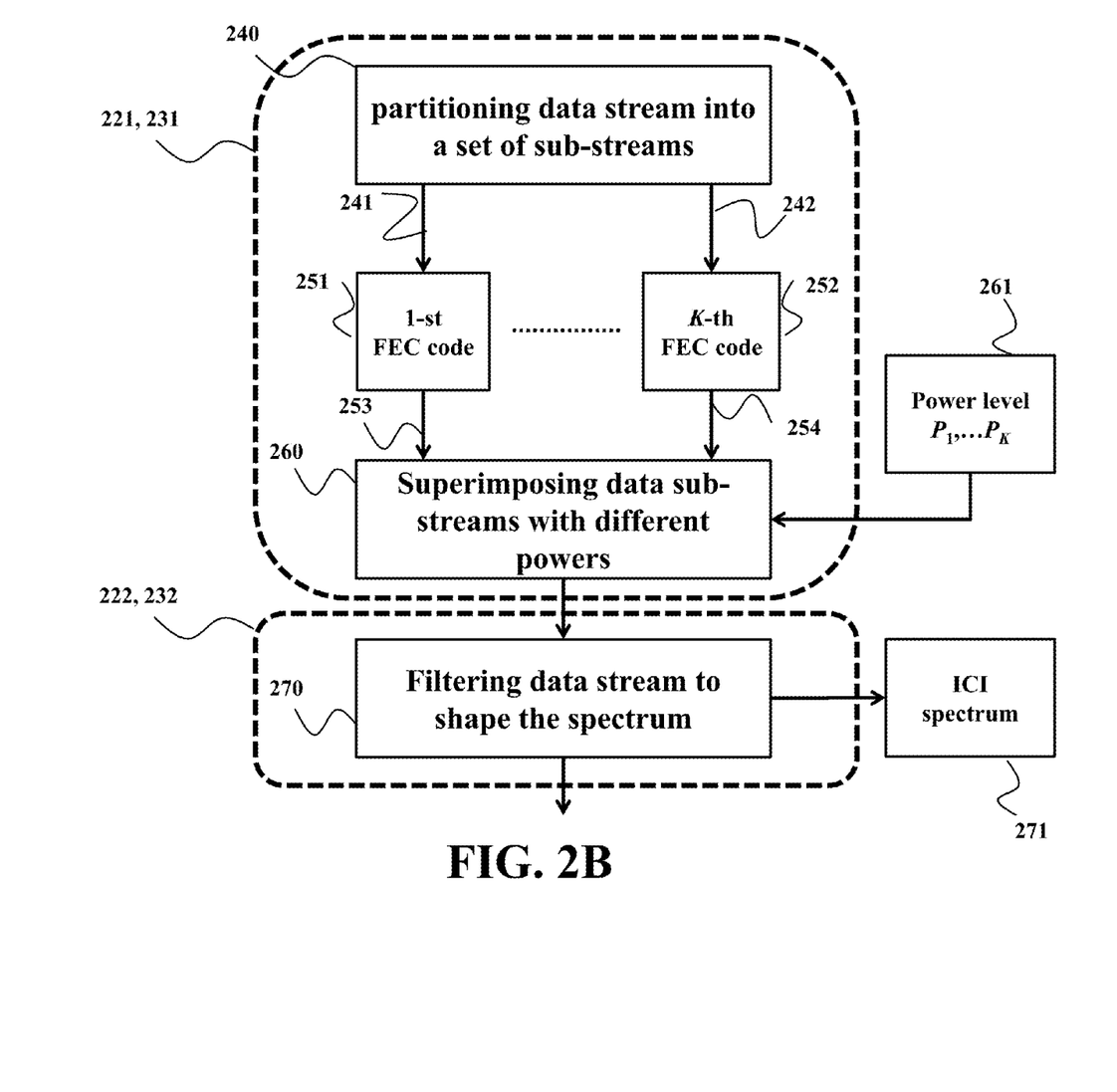
FIG. 2B is a schematic of the operation of a sub-channel encoder and spectral shaping filter according to one embodiment of the invention.

FIG. 2B shows a schematic of the operation of each sub-channel transmitter 220 and 230 according to one embodiment of the invention. These operations can be implemented using the encoders 221, 231 and the spectral shaping filters 222, 232. This embodiment is based on recognition that in some situations the joint decoding of the larger data can limit the data rate of the transmission. Also, the embodiments are based on recognition of benefits and adaptability of the Han-Kobayashi method to the super-channel transmissions with extra equalization of portions of the data stream received due to the ICI.

Based on this recognition, each of the sub-channel encoders 221, 231 partitions 240 the data stream into a set of equal or unequal portions, i.e., sub-streams, such as a first sub-stream 241 and a $K^{th}$ sub-stream 242. The different sub-streams 241, 242 are individually encoded 251, 252 with equal or different FEC codes to produce a set of encoded sub-streams 253, 254 for each data stream. In one embodiment, the FEC codes are different for each data stream, i.e., unique, to facilitate decoding by the receiver. For example, the first data sub-stream and the $K^{th}$ data sub-stream is encoded by a first FEC code 251 and a $K^{th}$ FEC code 252, respectively. The encoded sub-streams 253, 254 are superimposed 260 with equal or unequal power levels 261 to form a single encoded data stream per sub-channel transmitter.

The number of sub-streams for each data stream, i.e., K, can be any integer greater than one, and ranges up-to the total number of all possible combinations of sub-channels, i.e., $K<2^N$. In one embodiment, K=2 is used, in which the first sub-stream is individual to be decoded only at an intended sub-channel receiver and the second sub-stream is common to be decoded at all sub-channel receivers.

Additionally or alternatively, some embodiments consider three adjacent sub-channels (the intended sub-channel, the neighboring sub-channel at lower frequency, and the other neighboring sub-channel at higher frequency) by partitioning the data stream into K=4 sub-streams. The first sub-stream is only for the intended sub-channel receiver, the second sub-stream is for all sub-channel receivers, the third sub-stream is for two receivers including the intended sub-channel and the lower-frequency next sub-channel, and the fourth sub-stream is for two receivers including the intended sub-channel and the higher-frequency next sub-channel.

In some embodiments, the FEC-encoded sub-streams are superimposed 260, with different power levels $(P_1, \ldots, P_K)$ 261. The superimposed data stream is filtered 270 for the purposes of spectral shaping, with the ICI spectrum 271 being partially determined by a profile of the spectral shaping filters. In one embodiment, the sub-stream superposition 260 and spectrum filtering 270 are jointly performed with different spectrum filters as well as different power levels to combine all sub-streams. In one embodiment, the superposition is a function of the addition of the sub-streams. For example, the superimposition of the sub-streams $x_1$ and $x_2$ result in sqrt($\lambda$) $x_1$+sqrt($1-\lambda$) $x_2$ with power split $\lambda$.

In some embodiments, the filtering 270 of the encoded data streams is performed to preserve the ICI during the transmitting and to control a total power of a spectrum of the ICI optimizing a data rate of the transmitting, as described below. In various embodiments of the invention, different combinations of data rates for partitioning the data streams, different FEC codes for encoding the sub-streams, different powers for superimposing sub-streams, and different profiles of the filters to shape the spectrum of the ICI are used to maximize the data rate of the transmission.

Figure 3A:
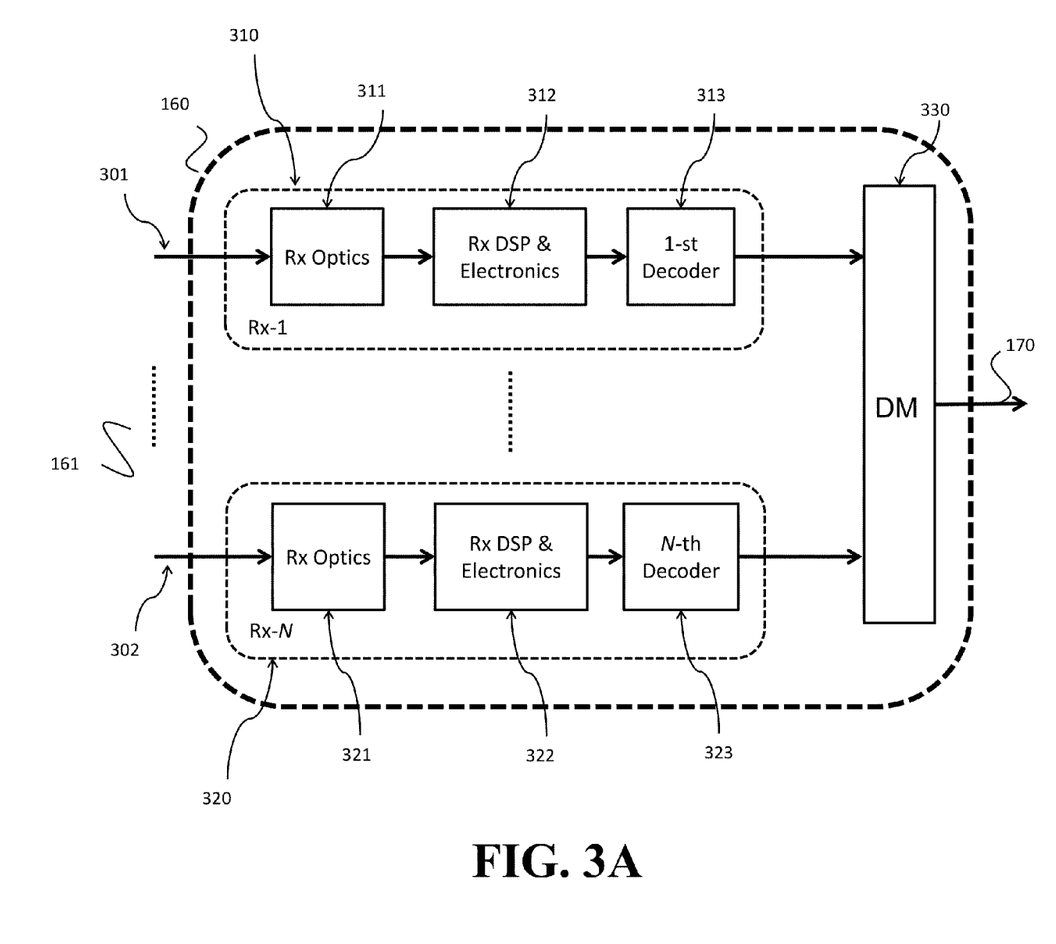
FIG. 3A is a block diagram of a super-channel receiver according to some embodiments of the invention.

FIG. 3A shows a block diagram of a super-channel receiver 160 according to some embodiments of the invention. The WDM 150 receives and de-multiplexes the multiplexed encoded data streams received over the optical super channel as the optical signal and produces a set of received data streams including one received data stream 301, 302 for each sub-channel. The received data streams are sent to a corresponding sub-channel receiver, e.g., 310 or 320. The sub-channel receivers can include an optical front end 311, 321, e.g., receiver optical sub-assembly (ROSA) demodulator, followed by an electrical and electronic processing module 312, 322 to aid decoding of received data streams. For example, the electronic processing module includes low-pass filter, clock timing recovery, chromatic dispersion recovery, carrier phase recovery, nonlinearity compensation, and polarization recovery. In one embodiment, the low-pass filter uses NS-RRC filter. The received data streams are individually sent to a set of sub-channel decoders 313, 323 for decoding. The decoded data streams are then combined by a data multiplexer (DM) 330 to produce data 170 representing the data 110.

In various embodiments of the invention, the received data stream includes at least portions of encoded sub-streams transmitted over different sub-channels. For example, the received data stream for a sub-channel can include at least one ICI sub-stream received due to the ICI and at least one non-ICI sub-stream transmitted over the intended sub-channel. In some embodiments, each sub-channel receiver includes multiple decoders for decoding, jointly or successively, each encoded sub-stream of the received data stream to produce the set of decoded sub-streams.

Figure 3B:
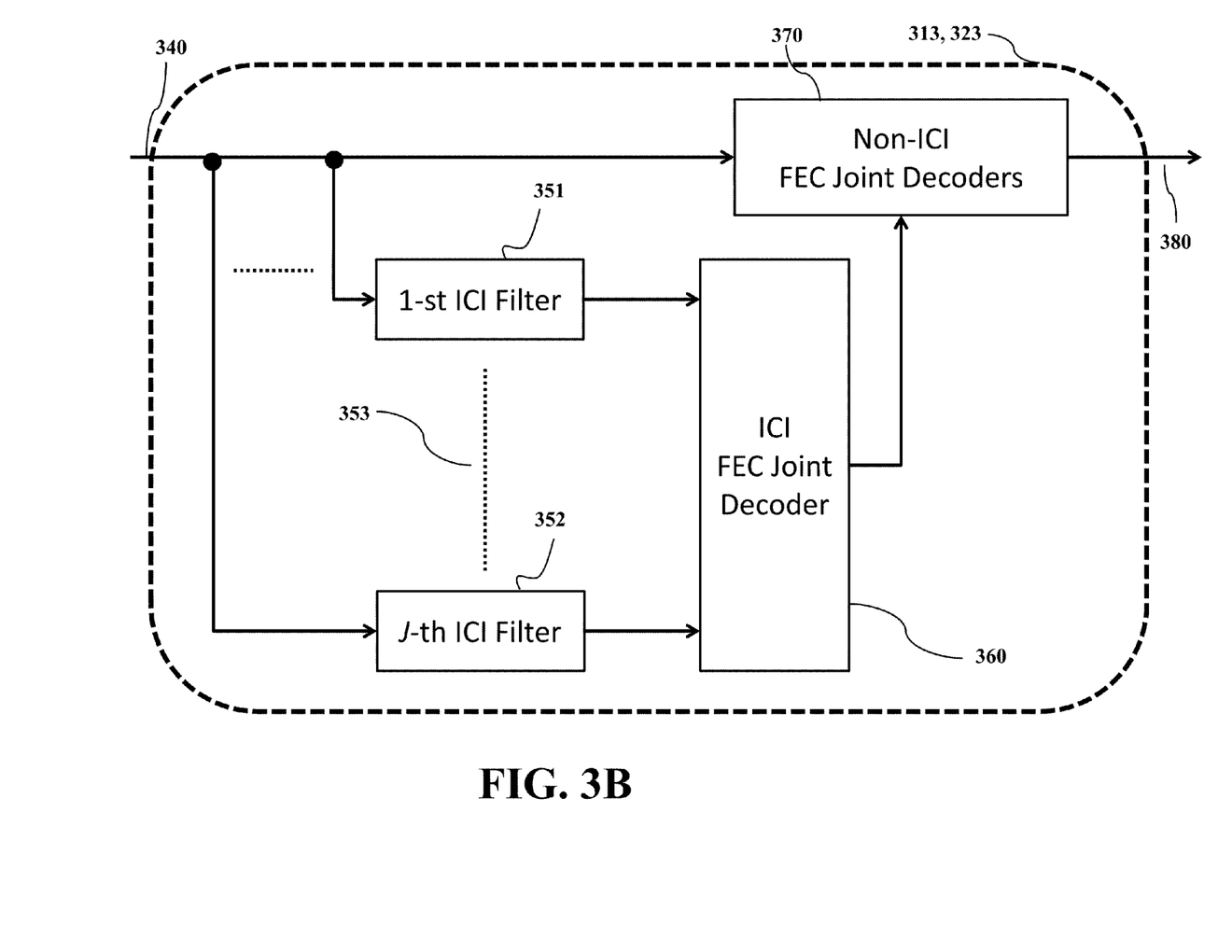
FIG. 3B is a schematic of a sub-channel decoder according to some embodiments of the invention.

FIG. 3B shows a schematic of a sub-channel decoder 313, 323 for receiving and decoding the data stream encoded by the sub-channel encoder 221, 231. According to this embodiment, the sub-channel receiver includes a filter for filtering the ICI sub-stream according to a spectrum of the ICI to equalize the ISI, and the multiple decoders of the sub-channel receiver are configured for decoding the filtered ICI sub-stream to produce a decoded ICI sub-stream, and for decoding the non-ICI sub-stream using the decoded ICI sub-stream.

For example, the received data stream 340 is sent to one or several equalization filters 351, 352 to retrieve the common sub-streams from the received data stream 340. For example, in one embodiment, the equalization filter is a matched filter of ICI spectrum of the other sub-channels 271 to equalize ISI. In one embodiment, rather than using matched filters, joint maximum a posteriori probability (MAP) equalization or maximum-likelihood sequence equalization (MLSE) is performed to take nonlinearity of the noise into account. For example, the data sub-stream possibilities are calculated by nonlinear ICI spectrum, and compared with received data to generate log-likelihood ratio (LLR) used to decode the sub-streams.

In some embodiments of the invention, the set of common data-streams 353 includes at least portions of one or combinations of the sub-streams transmitted by all different sub-channel transmitters. The number of ICI equalization filters, i.e., J, depends on the number of data sub-streams at different sub-channel transmitters and the combinations of common data assignments. For example when each of N=4 sub-channel transmitters splits into K=2 sub-streams (i.e., one for individual sub-stream and the other for common sub-streams), the number of total sub-streams is NK=8, within which the number of common sub-streams from neighboring sub-channels is J=(N−1)=3.

The equalized ICI sub-streams are jointly decoded by an ICI FEC joint decoder 360, and submitted to another non-ICI FEC joint decoder 370. For example, the ICI FEC joint decoder is implemented by J cascaded FEC decoders to successively decode and cancel ICI sub-streams in an ascending order of FEC code rates of sub-streams. The non-ICI FEC joint decoder uses the decoded ICI sub-streams to cancel out from the original incoming data 340 to decode the intended sub-channel stream, i.e., K different FEC-coded sub-streams 251, 252. The non-ICI FEC joint decoder can also be implemented by K cascaded FEC decoders for successive decoding. The decoded sub-streams 380 are sent to the DM 330.

Super-Channel Transceiver Optimization

The data partitioning 240 in the sub-channel encoder adds flexibility used by some embodiments of the invention to maximize the data rates of the optical super-channel transmission. For example, some embodiments of the invention use different combinations of data rates for partitioning the data streams, the power ratio for super-positioning the sub-streams, the rates and the FEC codes for encoding the sub-streams, the combinations of joint decoding, which can include individual or joint decoding of common sub-streams by decoders of one or multiple sub-channel receivers, and individual or joint decoding of individual sub-streams by decoders of one or multiple sub-channel receivers. The FEC codes, power ratios, and spectral shaping filters are optimized 180 to improve data rates of optical communications, by considering ICI spectrums over the neighboring sub-channels. In some embodiments of the invention, the optimization is performed using a suitably programmed processer.

Figure 4A:
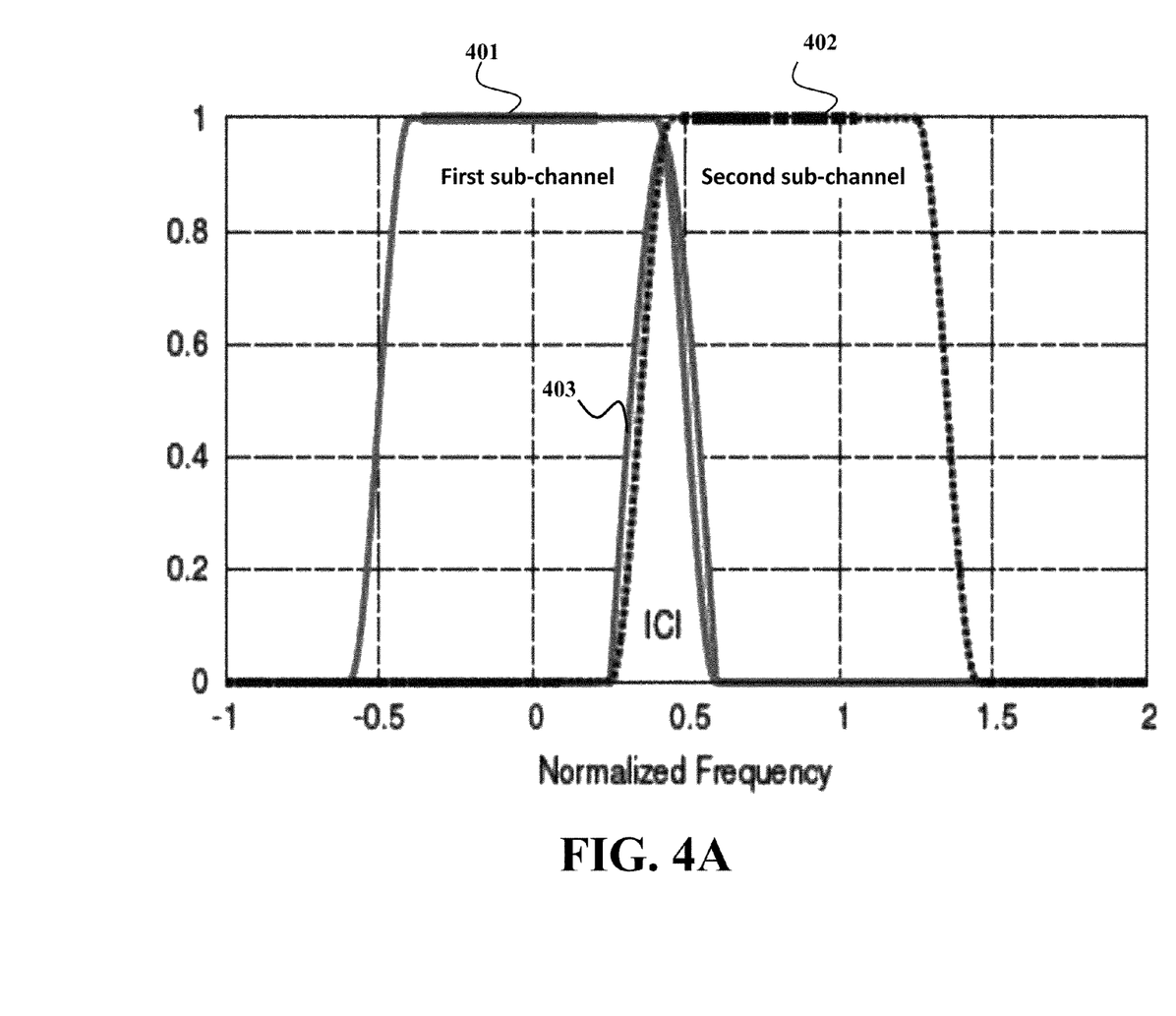
FIG. 4A is a frequency domain representation of the power and spectrum of an inter-channel interference (ICI) between a pair of sub-channels.

FIG. 4A shows a frequency-domain representation of the ICI spectrum of two adjacent sub-channels. In this example, the first sub-channel 401 and the second sub-channel 402 have identical spectra separated by some frequency gap. The spectra of the first and the second sub-channels overlap to cause the ICI. The curve 403 that bounds the overlap of the two sub-channel spectra determines the ICI spectrum, and the area beneath the curve 403 determines the total power of the ICI.

The ICI spectrum and power depends on the transmitter filter and the receiver filter, such as a root-raised cosine (RRC) filter, Bessel filter, Butterworth filter, super-Gaussian filter, etc. Some embodiments of the invention adjust the filters to preserve the power of the ICI. The ICI has intersymbol interference (ISI) due to a violation of Nyquist condition, and frequency offset due to a frequency gap between sub-channels of the optical super-channel. Some embodiments of the invention use the spectrum knowledge of the ICI to decode portions of the data streams transmitted on neighboring sub-channels. The ICI power increases a proportion of the ICI data that can be decoded.

In some embodiments, the ICI power is adjusted by using non-reciprocal filters pair with different bandwidth. For example, the transmitter uses NS-RRC filter with frequency domain transfer function $$H(f) = \begin{cases} T^{\varepsilon}, & |f| < \frac{1-\alpha}{2}B \\ \left(\frac{1}{2B} + \frac{1}{2B}\cos\left(\pi \frac{1}{\alpha B}|f| - \pi \frac{1-\alpha}{\alpha}\right)\right)^{\varepsilon}, & \frac{1-\alpha}{2}B < |f| < \frac{1+\alpha}{2}B \\ 0, & \text{otherwise} \end{cases}$$

where B is a baud rate, $\alpha$ is a roll-off factor, and $\epsilon$ is an exponent. The receiver uses another NS-RRC filter with a roll-off factor and/or exponent values being different from the transmitter. In contrast with square RRC filter with the exponent set to 0.5 resulting in identical roll-off factor for both the transmitter and the receiver, some embodiments of the invention adjust the roll-off factor and exponent values to achieve the desired power for ICI data.

Figure 4B:
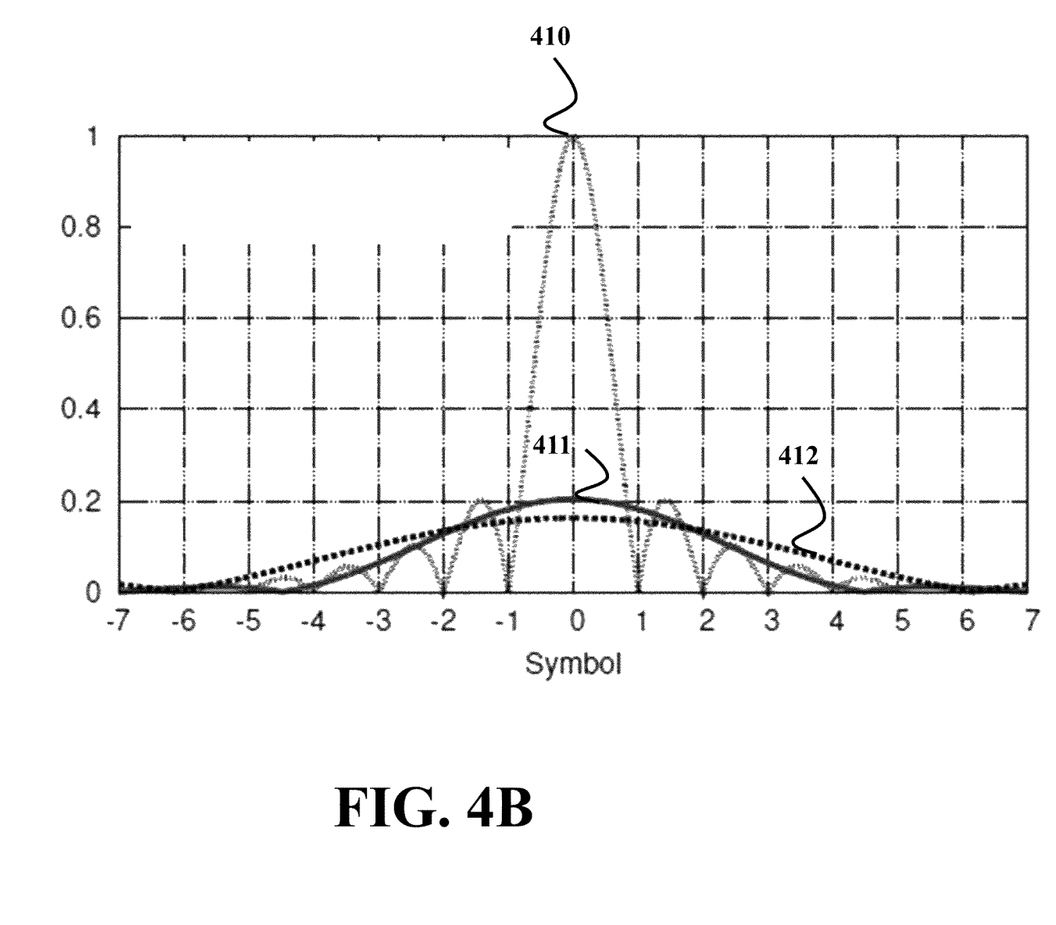
FIG. 4B is a time domain representation of the portions of data stream transmitted over intended and neighboring sub-channels.

FIG. 4B shows a time-domain impulse response of the first data stream transmitted over the first sub-channel 410 and the ICI data streams transmitted over neighboring, e.g., the second, sub-channels 411, 412. One ICI impulse response 411 is an example of the data stream filtered by an RRC filter of roll-off factor $\alpha$=0.2, while the other ICI impulse response 412 is the filter of roll-off factor $\alpha$=0.05. Because the ICI spectrum has a memory, the ICI impulse responses 411, 412 have non-zero signal energy distributed over several symbols, leading to the ISI. In the receiver, the ICI impulse response is used to decode portions of adjacent sub-channels. The ISI memory length becomes longer when the filter uses a narrower bandwidth with a smaller roll-off factor. The ISI memory determines the ICI power to receive common sub-streams in the sub-channel receiver.

For example, two sub-channel transmitters transmit coded-modulation data streams $s_1$ and $s_2$, respectively, at sub-channel frequencies $f_1$ and $f_2$. The sub-channel spacing normalized by the baud rate is $\delta f=(f_2-f_1)/B$. For super-channel transmission, the sub-channel spacing is dense such that $\delta f<1+\alpha$, leading to the ICI 403 (FIG. 4A is for the case of $\delta f$=0.85 and $\alpha$=0.2).

The system model for the first and the second sub-channel receivers $r_1$ and $r_2$, respectively, can be simplified as $$r_1 = s_1 + \sqrt{\beta}s_2 + n_1, \tag{1}$$

$$r_2 = \sqrt{\beta}s_1 + s_2 + n_2, \tag{2}$$

where $\beta$ is a ratio between interference and desired signal powers, and $n_k$ is additive Gaussian noise with a variance of $1/\rho$ for a signal-to-noise power ratio (SNR) of $\rho$. Adjusting the filter shapes with different roll-off factors $\alpha$ and exponents $\epsilon$ changes the interference ratio of $\beta$ to maximize the sum of data rates.

Some embodiments modify the model of ICI as in Equations (1)-(2) by taking the ISI memory and/or phase rotation of the ICI into account. For example, the impulse response magnitude of the ICI has ISI memory as in an example of FIG. 4B. The impulse response of the desired signal 410 has no ISI at an integer multiple of the symbol timing because of the filter satisfies the Nyquist criterion. Although the peak power of the impulse response for the ICI 411 is lower than the desired signal, the ICI 412 has longer memory especially for a smaller roll-off factor.

Therefore, some embodiments use an equalizer to decode interference signals for joint decoding. Let L and h(z) be the equalizer memory length and the impulse response of ICI signal, respectively. Using a finite-memory MAP equalization, the signal power within the memory $\Sigma_{k=-L/2}^{L/2}|h(k)|^2$ contributes to the interference power $\beta$, and the reminder outside of the memory is added to the noise variance $1/\rho$.

Figure 5:
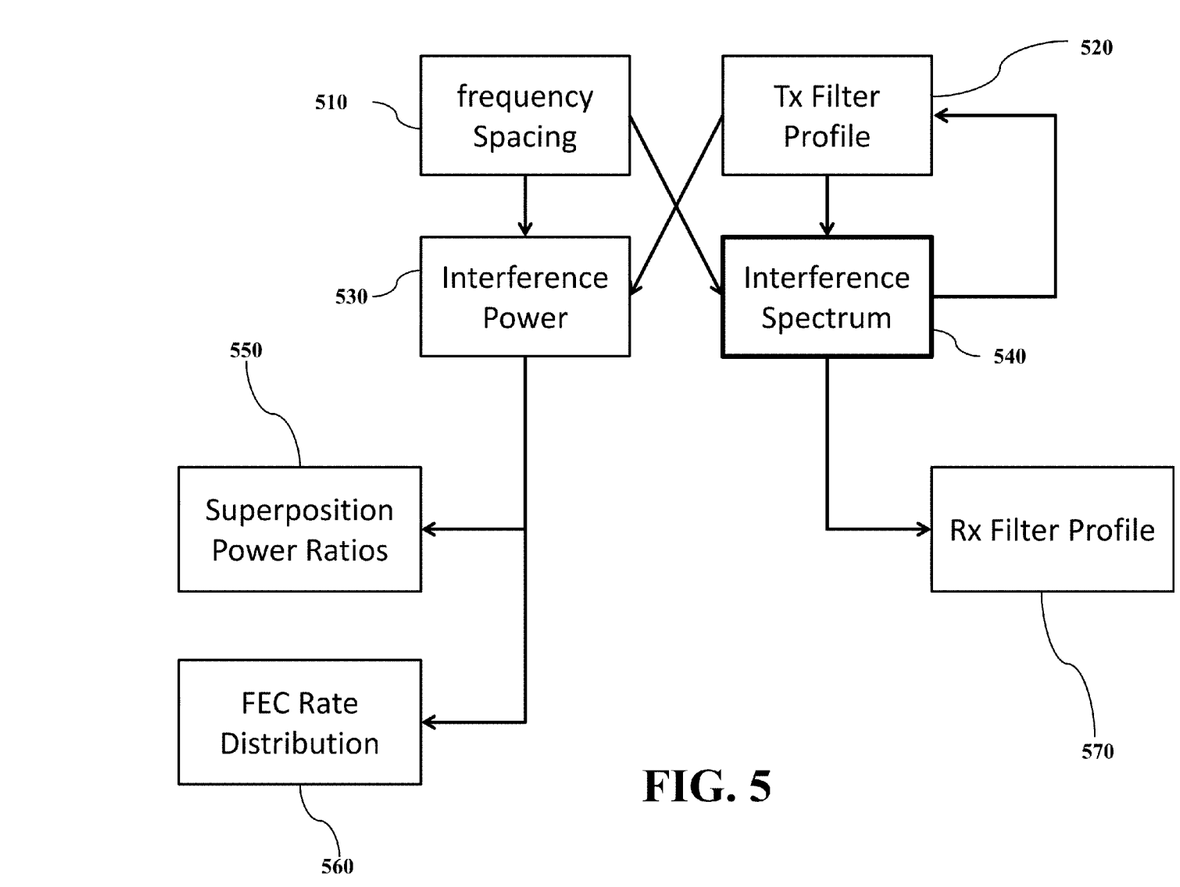
FIG. 5 is a schematic of a method for super-channel transceiver optimization according to some embodiments of the invention.

FIG. 5 shows a schematic of a method for super-channel transceiver optimization 180 according to some embodiments of the invention. The system optimizes FEC codes and spectral shaping filters based on an analysis of the interference and SNR at each sub-channel of the super-channel, and commanding to the transmitters and the receivers to modify the encoding/decoding procedures. The analysis can be based on measurements in the optical domain, or settings provided to the sub-channel transceivers.

The embodiments determine the ICI power levels 530 and the ICI spectrum 540 using the frequency spacing 510 between the sub-channels and transmitter (Tx) filter profiles 520 of the spectral shaping filters for the transmission over the super-channel. For example, the ICI spectrum and impulse response h(z) become the convolution of the transmitter NS-RRC filter and the receiver NS-RRC filter with δf sub-channel spacing, which causes phase rotation over time. The ICI power $\beta$ is proportional to the total power spectrum within the equalization memory L, i.e., $\Sigma_{k=-L/2}^{L/2}|h(k)|^2$.

Some embodiments use the ICI power level 530 to determine super-position power ratios 550, and rate distributions of FEC codes 560 for all sub-channel transmitters.

The embodiments use the power ratios 550 for each sub-channel transmitter to allocate different power levels 261 for superimposing data sub-streams. Similarly, the embodiments determine different codes and rates of the FEC 251, 252.

For example, the coded data stream $s_k$ is a super-position of two codewords of sub-streams $u_k$ and $w_k$. The sub-stream $u_k$ is an individual sub-stream decoded only at the intended sub-channel receiver. The sub-stream $w_k$ is a common sub-stream decoded at the receivers for neighboring sub-channels. Two codewords for individual $u_k$ and common $w_k$ sub-streams are superposed with a power ratio splitting $\lambda_k$ and $1-\lambda_k$. The achievable data rate of the embodiment with a symmetric power splitting case, i.e., two sub-channel transmitters use the identical power splitting $\lambda_1=\lambda_2$, is $$R_{HK} = \begin{cases} 2C\left(\frac{\rho}{1+\beta\rho}\right), & \rho \le \rho_1, \\ 2C\left(\frac{(\beta^2\rho+\beta-1)(1-\beta)+\beta\rho}{1+\beta(\beta^2\rho+\beta-1)}\right), & \rho_1 < \rho \le \rho_2, \\ C\left(\frac{1-\beta}{2\beta}\right)+C\left(\frac{(1+\beta)^2\rho-(1-\beta)}{2}\right), & \rho_2 < \rho, \end{cases} \quad (3)$$

where $$\rho_1 = \frac{1-\beta}{\beta^2}, \rho_2 = \frac{1-\beta^3}{\beta^3(\beta+1)},$$

and $C(\rho)=\log_2(1+\rho)$. One embodiment to achieve the maximum data rates uses the optimal power splitting given as $$\lambda_1 = \lambda_2 = \begin{cases} 1, & \rho \le \rho_1, \\ \frac{\beta^2\rho+\beta-1}{\beta}, & \rho_1 < \rho \le \rho_2, \\ \frac{1-\beta}{(1+\beta)\beta\rho}, & \rho_2 < \rho, \end{cases} \quad (4)$$

depending on the ICI power $\beta$ and the SNR $\rho$.

One embodiment uses an asymmetric power splitting with $\lambda_1=0$ and $\lambda_2>0$, i.e., one sub-channel transmitter sends only common sub-stream and the other sub-channel transmitter sends both individual and common sub-streams, to achieve slightly higher data rates in high SNR regimes. For example, the optimal power splitting $\lambda_2$ is a root of an equation $$\frac{(1+\lambda_2+\beta\rho)(1+\beta\rho)}{1+\beta\lambda_2\rho} = \sqrt{(1+\lambda_2\rho)(1+\beta\lambda_2\rho)},$$

which can be solved numerically.

Additionally, some embodiments determine data rate distribution of FEC codes 560 according to the spectrum, the power of the ICI and SNR. The data rates can be used for partitioning 240 the data stream into unequal sub-streams 241, 242. For example, the individual sub-stream of the first sub-channel transmitter uses the FEC code rate of $$C\left(\frac{\lambda_1\rho}{1+\lambda_2\beta\rho}\right),$$

the individual sub-stream of the second sub-channel transmitter uses the FEC code rate of $$C\left(\frac{\lambda_2\rho}{1+\lambda_1\beta\rho}\right).$$

The common sub-stream of the first sub-channel transmitter uses the FEC code rate of $$C\left(\frac{(1-\lambda_1)\beta\rho}{1+\lambda_2\rho+\lambda_1\beta\rho}\right) \text{ or } \frac{1}{2}C\left(\frac{(1-\lambda_1)\rho+(1-\lambda_2)\beta\rho}{1+\lambda_1\rho+\lambda_2\beta\rho}\right)$$

depending on SNR, and the common sub-stream of the second sub-channel transmitter uses the FEC code rate of $$C\left(\frac{(1-\lambda_2)\beta\rho}{1+\lambda_1\rho+\lambda_2\beta\rho}\right) \text{ or } \frac{1}{2}C\left(\frac{(1-\lambda_2)\rho+(1-\lambda_1)\beta\rho}{1+\lambda_2\rho+\lambda_1\beta\rho}\right)$$

depending on SNR.

Some embodiments of the invention use the spectrum to further optimize the profiles of the transmitter 520 and receiver 570 filters. For example, adjusting roll-off factors $\alpha$ and exponent values $\epsilon$ of NS-RRC filters changes the total ICI power $\beta$ within the equalization filter memory L. The embodiment optimizes those filter values depending on SNR $\rho$ to have the maximum possible data rates $R_{HK}$ in Equation (3). Some embodiments analyze the interference channel and SNR in real time during the transmission to dynamically optimize the filter profiles for wavelength-dependent non-linear channels.

For example, in one embodiment, the optimization module 180 detects a change of the spectrum of the ICI and SNR of each sub-channel of the super-channel during the transmission of the data command 181, 182 to modify one or combination of the data rates and the power ratio in response to detecting the change. In some embodiments the optimization module determines iteratively roll-off factors and exponents of the filtering until a termination condition, e.g., a predetermined number of iterations, is met. For example, in one embodiment, each iteration includes determining data rates for the spectrum and the power of the ICI and adjusting the roll-off factors and exponents of the filtering using, e.g., a gradient update of Equation (3), increasing the data rates.

Cooperative Super-Channel Transmission

Some embodiments of the invention use cooperative super-channel transmission, i.e., one sub-channel transmitter uses information about at least a portion of the data stream transmitted by the other sub-channel transmitter. For example, some embodiments use dirty paper coding (DPC) to cancel the interference in advance.

For example, one embodiment encodes at least some of the sub-streams of different data streams cooperatively based on a nested joint FEC code and superposes at least some of the encoded sub-streams of different data streams using the DPC to reduce the ICI. For example, the nested joint FEC code can be a low-density-parity-check (LDPC) code with a Tomlinson-Harashima precoding (THP), achieving the sum of data rates over 2-channel $$R_{DPC} = C(\rho(1-\lambda)) + C\left(\frac{\rho(1+\lambda)}{1+\beta\rho(1-\lambda)}\right), \quad (5)$$

where $\lambda$ determines the power allocation to the first and the second sub-channels. One embodiment uses unequal power allocation to sub-channel transmitters to maximize the sum of data rates, in which an optimal power is given by $$\lambda = \frac{1+\beta\rho - \sqrt{1+2\beta\rho}}{\beta\rho}.$$

Figure 6A:
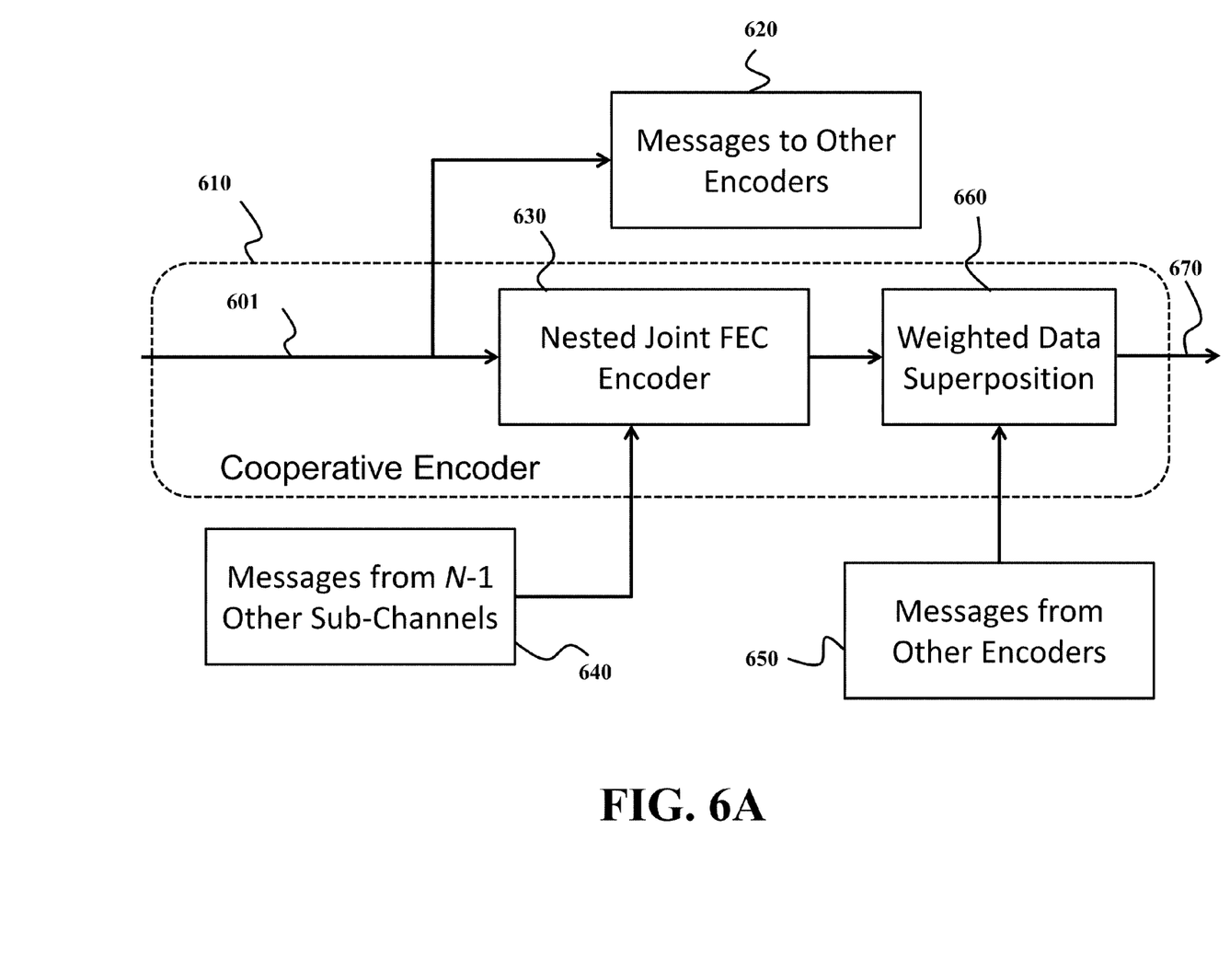
FIG. 6A is a block diagram of a method for cooperative sub-channel encoding according to one embodiment of the invention.

FIG. 6A shows a schematic of a cooperative sub-channel encoder. The incoming data stream 601 is shared with the other N−1 encoders 620. Joint encoding is performed with the incoming data stream 601, and data from the other N−1 sub-channels 640 of the super-channel. Weighted super-positioning is performed 660 using both the output of the joint encoder 630 and messages from the other N−1 encoders 650, before the coded data stream is sent for further processing 670. For example, joint FEC encoder 630 includes a nested repeat-accumulate code to realize DPC principle. The weighted data super-position 660 uses the ICI spectrum information from the receiver to cancel it based on DPC principle.

Figure 6B:
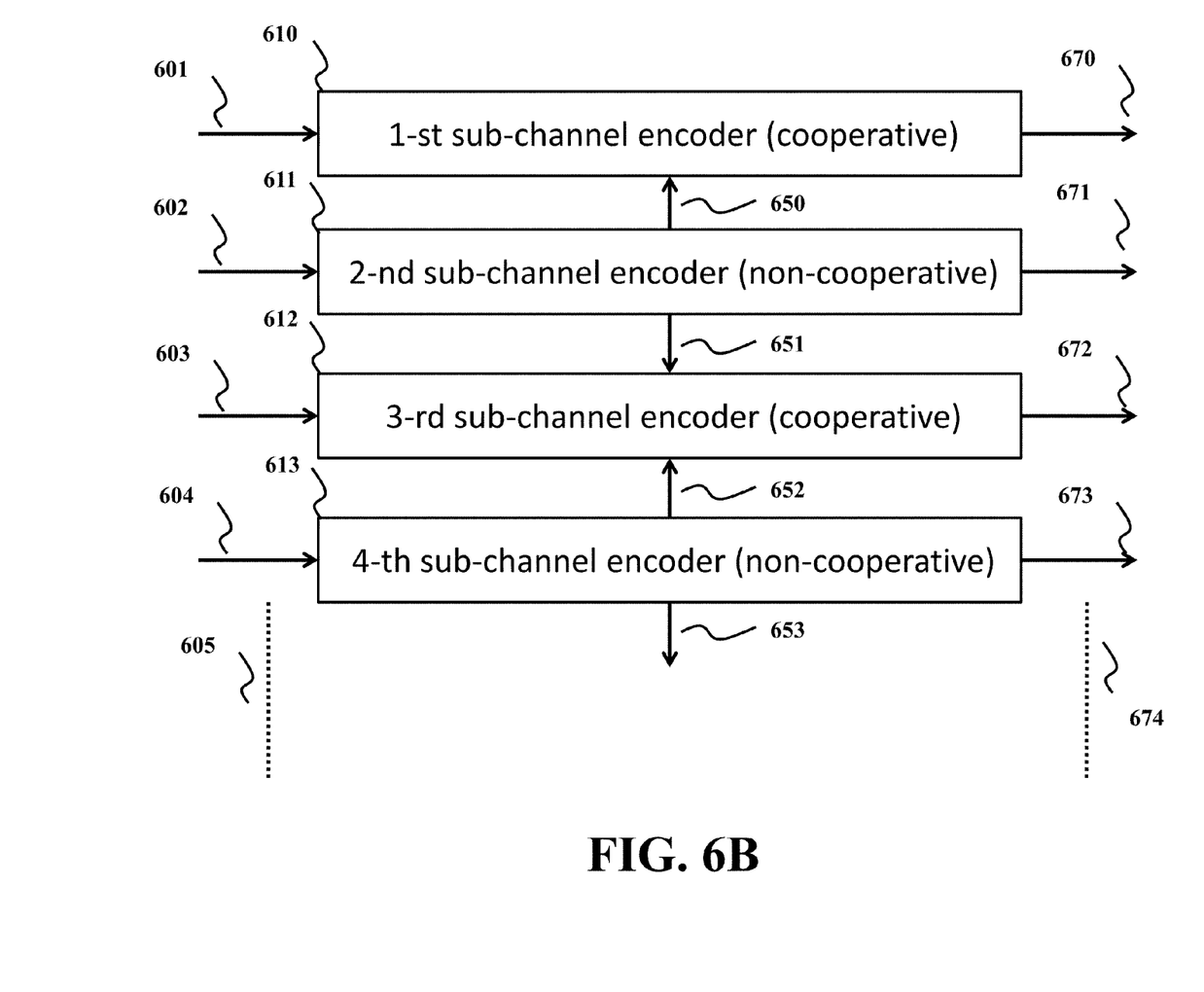
FIG. 6B is a schematic of a cooperative super-channel encoding according to one embodiment of the invention.

FIG. 6B shows a schematic of the comb-like DPC cooperative encoding super-channel transmitter with N sub-channel encoders 610, 611, 612, 613 according to some embodiments of the invention. The embodiments are based on a recognition that the ICI comes in general from closest-neighbor, e.g., adjacent, sub-channels. Accordingly, some embodiments alternate cooperative and non-cooperative encoding.

For example, each sub-channel encoder encodes incoming data 601, 602, 603, 604, 605 from the DDM 210 to produce encoded data streams 670, 671, 672, 673, 674. This embodiment uses cooperative encoders 610, 612 at the odd number sub-channels, and non-cooperative encoders 611, 613 at the even number sub-channels. The non-cooperative encoders first encode the incoming data streams without using data for the other sub-channels. The cooperative encoders next encode the data streams using the data from the closest-neighbor sub-channels. For example, the first sub-channel encoder 610 uses a nested joint FEC code 630 with data 650 from the second sub-channel encoder 611, the third sub-channel encoder 612 feeds both data 651 and 652 from the second and forth sub-channel encoders 611 and 613, respectively.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A method for transmission of data from a transmitter to a receiver over an optical super-channel including a set of sub-channels of different frequencies, comprising:
   partitioning the data into a set of data streams including one data stream for each sub-channel;
   partitioning each data stream into a set of sub-streams;
   encoding each sub-stream of each data stream with a corresponding forward error correction (FEC) code to produce a set of encoded sub-streams for each data stream, wherein at least two encoded sub-streams in the set of encoded sub-streams are encoded with different FEC codes;
   superimposing the set of encoded sub-streams of each data stream to produce a set of encoded data streams, wherein at least two encoded sub-streams in the set of encoded sub-streams are superimposed with different powers, wherein the superimposing comprises:
   determining an inter-channel interference (ICI);
   determining a data rates and a power ratio for the data stream according to a spectrum of the ICI and a power of the ICI;
   partitioning a first data stream into a first individual sub-stream and a first common sub-stream according to the data rates;
   partitioning a second data stream into a second individual sub-stream and a second common sub-stream according to the data rates;
   encoding the first individual sub-stream with a first FEC code, encoding the first common sub-stream with a second FEC code, encoding the second individual sub-stream with a third FEC code, encoding the second common sub-stream with a fourth FEC code, wherein the first FEC code is different from the third FEC code, and wherein the second FEC code is different from the fourth FEC code;
   superimposing the first individual sub-stream and the first common sub-stream according to the power ratio to produce a first encoded data stream; and
   superimposing the second individual sub-stream and the second common sub-stream according to the power ratio to produce a second encoded data stream;
   converting and multiplexing the set of encoded data streams to produce an optical signal; and
   transmitting the optical signal over the set of sub-channels of the optical super-channel.

2. The method of claim 1, further comprising:
   receiving, de-multiplexing, and converting the optical signal to produce a set of received data streams including one received data stream for each sub-channel, wherein the received data stream includes at least portions of encoded sub-streams transmitted over different sub-channels;
   decoding the encoded sub-streams of each received data stream to produce a set of decoded sub-streams; and
   combining the decoded sub-streams to produce the data.

3. The method of claim 2, wherein at least some of the encoded sub-streams of each received data stream are decoded successively.

4. The method of claim 2, wherein at least some of the encoded sub-streams of each received data stream are decoded jointly.

5. The method of claim 2, wherein the received data stream for a sub-channel includes at least one inter-channel interference (ICI) sub-stream received due to the ICI and at least one non-ICI sub-stream transmitted over the sub-channel, further comprising:
   filtering the ICI sub-stream according to a spectrum of the ICI to equalize an inter-symbol interference (ISI);
   decoding the filtered ICI sub-stream to produce a decoded ICI sub-stream; and
   decoding the non-ICI sub-stream using the decoded ICI sub-stream.

6. The method of claim 5, wherein the filtering uses a maximum a posteriori probability (MAP) equalization of ISI of the ICI sub-stream dispersed over L symbols according to a total power of the spectrum of the ICI $$\Sigma_{k=-L/2}^{L/2}|h(k)|^2,$$

wherein h(k) is an impulse response of the ICI sub-stream.

7. The method of claim 1, further comprising:
filtering the encoded data streams to preserve an inter-channel interference (ICI) during the transmitting and to increase a total power of a spectrum of the ICI optimizing a data rate of the transmitting.

8. The method of claim 1, wherein the first, the second, the third, and the fourth FEC codes are unique and determined based on the spectrum of the ICI.

9. The method of claim 1, further comprising:
filtering the first and the second encoded data streams according to the spectrum of the ICI using a non-square-root raised cosine (NS-RRC) filter preserving the ICI during the transmitting.

10. The method of claim 9, wherein the filtering comprises:
determining iteratively roll-off factors and exponents of the filtering until a termination condition is met, wherein an iteration includes:
determining data rates for the spectrum and the power of the ICI;
adjusting the roll-off factors and exponents of the filtering using gradient update increasing the data rates.

11. The method of claim 1, further comprising:
determining a spectrum and a power of an inter-channel interference (ICI) using frequency spacing between the sub-channels; and
filtering the encoded data streams to produce the spectrum of the ICI during the transmitting.

12. The method of claim 1, further comprising:
encoding at least some of the sub-streams of different data streams cooperatively based on a nested joint FEC code;
superposing at least some of the encoded sub-streams of different data streams using a dirty paper coding to reduce an inter-channel interference (ICI).

13. A system for transmission of data over an optical super-channel including a set of sub-channels of different wavelengths, comprising:
a data de-multiplexer (DDM) for splitting the data into a set of data streams including one data stream for each sub-channel;
a set of sub-channel encoders including one sub-channel encoder for each data stream for producing a set of encoded data streams, wherein each sub-channel encoder is configured for partitioning a data stream into sub-streams, encoding each sub-stream with different forward error correction (FEC) codes, and superimposing the encoded sub-streams with different powers to produce an encoded data stream of the set of encoded data streams, wherein the superimposing comprises:
determining an inter-channel interference (ICI);
determining a data rates and a power ratio for the data stream according to a spectrum of the ICI and a power of the ICI;
partitioning a first data stream into a first individual sub-stream and a first common sub-stream according to the data rates;
partitioning a second data stream into a second individual sub-stream and a second common sub-stream according to the data rates;
encoding the first individual sub-stream with a first FEC code, encoding the first common sub-stream with a second FEC code, encoding the second individual sub-stream with a third FEC code, encoding the second common sub-stream with a fourth FEC code, wherein the first FEC code is different from the third FEC code, and wherein the second FEC code is different from the fourth FEC code;
superimposing the first individual sub-stream and the first common sub-stream according to the power ratio to produce a first encoded data stream; and
superimposing the second individual sub-stream and the second common sub-stream according to the power ratio to produce a second encoded data stream;
a set of transmitter optics for generating a set of optical wavelengths corresponding to the set of encoded data streams; and
an optical wavelength multiplexer (WM) for multiplexing the set of optical wavelengths to produce an optical signal and transmitting the optical signal over the sub-channels of the optical super-channel.

14. The system of claim 13, wherein at least some of the sub-channel encoders encode and superimpose corresponding sub-streams cooperatively using a dirty paper coding to reduce an inter-channel interference (ICI).

15. The system of claim 13, further comprising:
a set of a spectral shaping filter including one spectral shaping filter for each encoded data stream for filtering the set of encoded data stream to preserve an inter-channel interference (ICI) during the transmission.

16. The system of claim 13, further comprising:
an optical wavelength de-multiplexer (WDM) for receiving and de-multiplexing the optical signal to produce the set of optical wavelengths;
a set of optical front ends for processing the set of optical wavelengths to produce a set of received data streams including one received data stream for each sub-channel, wherein the received data stream includes at least portions of encoded sub-streams transmitted over different sub-channels;
a set of sub-channel decoders including one sub-channel decoder for received data stream for producing a set of decoded sub-streams; and
a data multiplexer (DM) for combining the decoded sub-streams to produce the data.

17. A system for transmission of data over an optical super-channel including a set of sub-channels of different wavelengths, comprising:
an optical wavelength de-multiplexer (WDM) for receiving and de-multiplexing the optical signal received over the optical super channel to produce a set of received data streams including one received data stream for each sub-channel;
a set of sub-channel receivers for receiving the set of received data streams including one received data stream for each sub-channel receiver, wherein the received data stream includes at least portions of encoded sub-streams transmitted over different sub-channels of the optical super-channel, wherein a sub-channel receiver includes multiple decoders for decoding, jointly or successively, each encoded sub-stream of the received data stream to produce a set of decoded sub-streams, wherein the received data stream for a sub-channel includes at least one inter-channel interference (ICI) sub-stream received due to the ICI and at least one non-ICI sub-stream transmitted over the sub-channel, wherein the sub-channel receiver includes a filter for filtering the ICI sub-stream according to a spectrum of the ICI to equalize a spectrum of an inter-symbol interference (ISI), and wherein the multiple decoders of the sub-channel receiver are configured for decoding the filtered ICI sub-stream to produce a decoded ICI sub-stream, and for decoding the non-ICI sub-stream using the decoded ICI sub-stream; and a data multiplexer (DM) for combining the decoded sub-streams to produce the data.

18. The system of claim 17, further comprising:

a data de-multiplexer (DDM) for splitting the data into a set of data streams including one data stream for each sub-channel;

a set of sub-channel encoders including one sub-channel encoder for each data stream for producing a set of encoded data streams, wherein each sub-channel encoder is configured for partitioning a data stream into sub-streams, encoding each sub-stream with different forward error correction (FEC) codes, and superimposing the encoded sub-streams with different powers to produce an encoded data stream of the set of encoded data streams; and an optical wavelength multiplexer (WM) for multiplexing the set of encoded data streams and transmitting the multiplexed encoded data streams over the sub-channels of the optical super-channel.

19. A method for transmission of data from a transmitter to a receiver over an optical super-channel including a set of sub-channels of different frequencies, comprising:

partitioning the data into a set of data streams including one data stream for each sub-channel;

partitioning each data stream into a set of sub-streams;

encoding each sub-stream of each data stream with a corresponding forward error correction (FEC) code to produce a set of encoded sub-streams for each data stream, wherein at least two encoded sub-streams in the set of encoded sub-streams are encoded with different FEC codes;

superimposing the set of encoded sub-streams of each data stream to produce a set of encoded data streams, wherein at least two encoded sub-streams in the set of encoded sub-streams are superimposed with different powers;

converting and multiplexing the set of encoded data streams to produce an optical signal;

transmitting the optical signal over the set of sub-channels of the optical super-channel;

receiving and de-multiplexing, and converting the optical signal to produce a set of received data streams including one received data stream for each sub-channel, wherein the received data stream includes at least portions of encoded sub-streams transmitted over different sub-channels;

decoding the encoded sub-streams of each received data stream to produce a set of decoded sub-streams; and combining the decoded sub-streams to produce the data, wherein the received data stream for a sub-channel includes at least one inter-channel interference (ICI) sub-stream received due to the ICI and at least one non-ICI sub-stream transmitted over the sub-channel, further comprising:

filtering the ICI sub-stream according to a spectrum of the ICI to equalize an inter-symbol interference (ISI);

decoding the filtered ICI sub-stream to produce a decoded ICI sub-stream; and decoding the non-ICI sub-stream using the decoded ICI sub-stream.

* * * * *